(12) United States Patent
Tanaka

(10) Patent No.: US 11,287,851 B2
(45) Date of Patent: *Mar. 29, 2022

(54) DIGITAL DEVICE DETOX ELEMENT AND METHOD

(71) Applicant: Bliss Tanaka, Honolulu, HI (US)

(72) Inventor: Bliss Tanaka, Honolulu, HI (US)

(73) Assignee: Bliss Tanaka, Honolulu, HI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/012,765

(22) Filed: Sep. 4, 2020

(65) Prior Publication Data

US 2020/0401192 A1    Dec. 24, 2020

Related U.S. Application Data

(63) Continuation-in-part of application No. 16/431,624, filed on Jun. 4, 2019, now Pat. No. 10,796,597.

(51) Int. Cl.
| | |
|---|---|
| *G06F 1/16* | (2006.01) |
| *H05K 5/03* | (2006.01) |
| *H04M 1/02* | (2006.01) |
| *H05K 5/02* | (2006.01) |

(52) U.S. Cl.
CPC .......... *G06F 1/1656* (2013.01); *H04M 1/026* (2013.01); *H04M 1/0283* (2013.01); *H05K 5/0243* (2013.01); *H05K 5/03* (2013.01)

(58) Field of Classification Search
CPC ..... G09B 19/00; G06F 1/1632; G06F 1/1626; H04M 1/667
See application file for complete search history.

(56) References Cited

U.S. PATENT DOCUMENTS

| | | | |
|---|---|---|---|
| 7,290,654 B2 * | 11/2007 | Hodges | H01H 9/0242 206/320 |
| 9,968,169 B1 * | 5/2018 | Pelton | H04B 1/3888 |
| 2005/0172886 A1 * | 8/2005 | Marcus | B42D 9/004 116/238 |
| 2013/0155610 A1 * | 6/2013 | Schroeder | G06F 1/1656 361/679.58 |
| 2016/0269079 A1 * | 9/2016 | Nambord | H04M 1/72445 |
| 2016/0277055 A1 * | 9/2016 | Zechner | H04M 1/185 |
| 2017/0054466 A1 * | 2/2017 | Flores | G06F 1/1656 |
| 2018/0343329 A1 * | 11/2018 | Robinson | H04M 1/026 |

* cited by examiner

*Primary Examiner* — Christopher M Brandt
(74) *Attorney, Agent, or Firm* — Kilpatrick Townsend & Stockton, LLP

(57) ABSTRACT

A detox element or sensor cover is placed at a first location over a sensor such as a camera used to activate a digital device. The sensor cover can leave the digital device in sleep mode until the detox element/sensor cover is removed. The detox element, when not in use for detoxing, is moved to a ready position. The ready position can be, for example, one of the corners of the digital device, where it is mostly out of the way of a touch screen display. The sensor cover is sufficiently small that in one embodiment it is mostly on a bezel of a phone, around a display, with only a small portion impinging on the display.

20 Claims, 11 Drawing Sheets

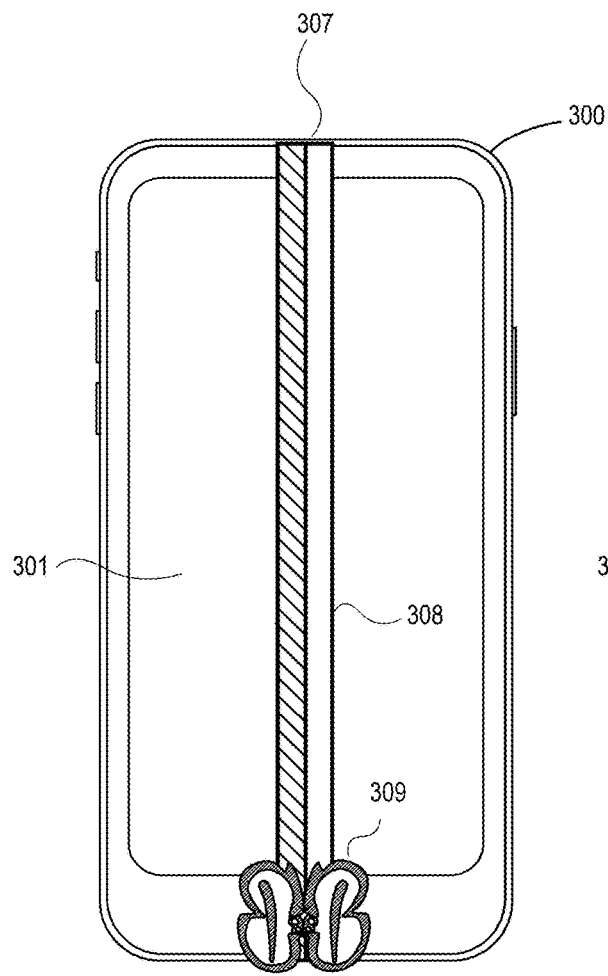
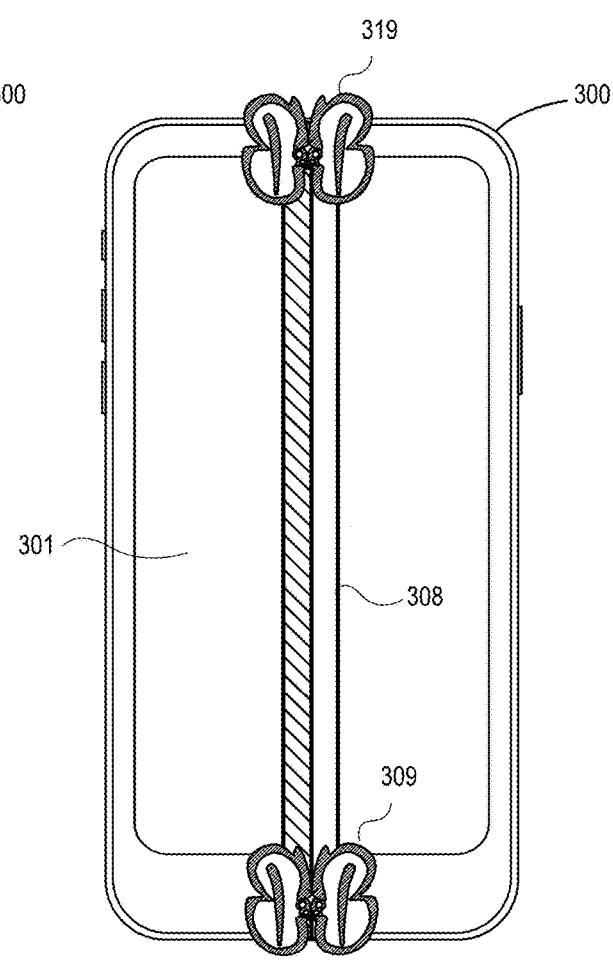
FIG. 3A
FIG. 3B

DIGITAL DEVICE DETOX ELEMENT AND METHOD

CROSS-REFERENCE TO RELATED APPLICATIONS

This application is a Continuation-in-Part of application Ser. No. 16/431,624 filed Jun. 4, 2019, entitled DIGITAL DEVICE DETOX BAND.

FIELD

Embodiments of the invention relate generally to mobile phones. More particularly, embodiments of the invention relate to a method of using a digital device detox element.

BACKGROUND

Digital devices such as mobile phones are ubiquitous and used by billions of people every day around the world. Common uses of such digital devices include social media, texting, instant messaging, online shopping, gaming etc., which in certain cases, is addictive and detrimental to users over time. For some users, when a digital device is on, a user can become impulsive leading to excessive use of the device. Such overuse of a digital device can have negative affects to a user such as interfering with work, school, relationships and self-mitigation of overuse deterrence. Although mobile devices can be placed in sleep mode (not active), the digital device can be easily activated for use by pressing the home button or placing a user's face in front of the camera for face activation if configured for face recognition. A user may intend to put the phone down and not interact, but it may inadvertently be activated by the user moving her/his face in front of the phone or device camera. Preventing ease of instant screen activation of a digital device can intercept digital device addiction and overuse of the digital device that can benefit the quality of life for mobile phone users.

Simply turning a device off is not as easy as it may seem psychologically. Internet companies use algorithms that encourage constant checking for new updates, likes, "click bait" articles, etc. Addictive non-academic digital interface media programming disallows for human interaction, self-care and physical activity which in turn may cause cranial and spinal atrophy and blue light blindness, amongst other emotional, mental and physical long-term ill effects. Intercepting access to constant, continuous and instantaneous mobile screen interface creates a prudent pause for the cause to mitigate addiction with self caring cognition by imposing a delayed response to mobile addiction.

SUMMARY

In a second embodiment set forth herein, a detox element or sensor cover is placed at a first location over a sensor such as a camera used to activate a digital device with face recognition. The detox element is a sensor cover that can be any shape and size having dimensions to sufficiently cover an activation sensor and disallow the digital device from being activated if in sleep mode. In this way, the sensor cover can leave the digital device in sleep mode until the detox element/sensor cover is removed. In one example, the sensor cover can include a motif (e.g., butterfly, flower, kitten, etc.) and cover other sensors as well. The sensor cover and motif can be any shape, color and design desired by the user. The motif can be an emoji, a small picture of a loved one or pet, or any other design that appeals to the user and thus enhances the desirability of using the detox process.

The detox element, when not in use for detoxing, is moved to a ready position. The ready position can be, for example, one of the corners of the digital device, where it is mostly out of the way of a touch screen display. The sensor cover is sufficiently small that in one embodiment it is mostly on a bezel of a phone, around a display, with only a small portion impinging on the display. Alternately, the sensor cover ready position could be any other position around the edge of the digital device.

In the first embodiment as described below, digital device detox bands are disclosed assisting with digital device addiction and overuse. For one example, a digital device band comprises an elastic part to stretch around a digital device having one or more sensors, and a cover that can be on the front of the band and connected to the elastic part. The cover is placed over and covers at least one of the one or more sensors to prevent the digital device from being activated while covering the one or more sensors. The one or more sensors can include a camera, a touch sensor, or an activation button. The first part can stretch horizontally or vertically to snugly fit around the digital device. Examples of a digital device can include a mobile phone, mobile computer or computing pad having varying dimensions.

For one example, the digital device detox band can include another cover that is placed over at least one of the sensors not covered by the second part. The covers can have a sufficient size and shape to be placed over the one or more sensors. The elastic part can include an elastic material such as silicone or other elastic and stretchable material such that it can stretch and snuggly fit around the digital device. For one example, a cover that is placed over a sensor can be one piece or unit with the elastic part made of the same elastic material.

For one example, a digital device includes multiple detox bands having an elastic part and at least one cover placed over at least one sensor that prevents activation of the digital device. For one example, a detox band can have two covers to cover at least two sensors. For other examples, the digital device can have at least two detox bands stretching around the digital device, each detox band having a respective cover placed over at least one sensor. The covers for the detox bands can include a motif of any size, shape or design that sufficiently covers one or more sensors. By using digital device detox band, a user can have a means or mechanism to prevent activation of the digital device until the detox band is removed.

Other bands, apparatuses, methods and devices are described.

BRIEF DESCRIPTION OF THE DRAWINGS

The appended drawings illustrate examples and are, therefore, exemplary embodiments and are not considered to be limiting in scope.

FIG. 3A illustrates an exemplary digital device such as a mobile phone that can have sensors on a top side or a bottom side used for activating the mobile phone and a detox band stretching vertically around the mobile phone with a cover covering a sensor on a bottom side.

FIG. 3B illustrates the exemplary digital device of FIG. 3A with a detox band stretching vertically around the mobile phone with a first cover covering a sensor on a bottom side and a second over covering a sensor on a top side.

DETAILED DESCRIPTION

First Embodiment—Digital Device Detox Band

Digital device detox bands are disclosed assisting with digital device addiction and overuse. A detox band includes an elastic part and a cover to be placed over at least one sensor of a digital device. The cover is positioned to cover a sensor that prevents activation of the digital device. Examples of a digital device can include a mobile phone, mobile computer, or a computing pad of any dimension having one or more sensors used to activate the digital device, e.g., a home button to activate the digital device when in sleep mode. Example sensors can include a camera, a touch sensor, or an activation button used to activate the digital device for use by a user. For one example, the detox band can stretch horizontally or vertically to snugly fit around the digital device such that a cover is placed over at least one sensor that can disallow activation of the digital device.

For one example, the elastic part includes an elastic material such as silicone that can stretch and snuggly fit around the digital device. The cover can be of any shape and size that sufficiently covers an activation sensor. The cover and the elastic part can form a single piece or unit made of the same elastic material. For one example, a detox band can have two covers placed over at least two sensors. For other examples, the digital device can have at least two detox bands stretching around the digital device, each detox band having a respective cover to cover at least one sensor that can prevent the digital device from activation. In this way, the digital device detox band provides a means or mechanism to prevent activation of the digital device until the detox band is removed. This can assist a user in dealing with digital device addiction or from overuse of a digital device with a material intervention that allows more intermittent (analog) mindfulness.

As set forth herein, various embodiments, examples and aspects will be described with reference to details discussed below, and the accompanying drawings will illustrate various embodiments and examples. The following description and drawings are illustrative and are not to be construed as limiting. Numerous specific details are described to provide a thorough understanding of various embodiments and examples. However, in certain instances, well-known or conventional details are not described in order to provide a concise discussion of the embodiments and examples.

Figure 1A:
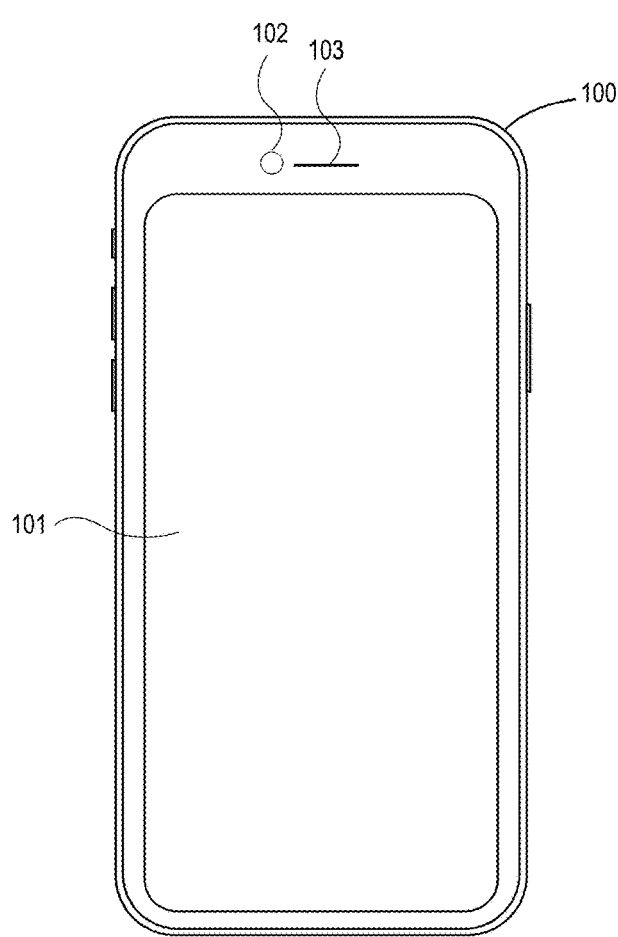
FIG. 1A illustrates an exemplary digital device such as a mobile phone with a sensor to activate the phone on a top side.

FIG. 1A illustrates an exemplary digital device such as a mobile phone 100 with a sensor 102 to activate the mobile phone 100 on a top side. For one example, mobile phone 100 can represent a generic phone for any make and model having a sensor 102 that includes a camera used to recognize a face of a user. In this example, mobile phone 100 is configured to activate and allow a user to use the mobile phone 100 after the face of the user is authenticated using a face recognition application. For one example, mobile phone 100 can operate in sleep mode such that touch display 101 is off and can be activated by face recognition using sensor 102. Although a touch to the touch display 101 can cause the display to turn on, the mobile phone 100 is configured to activate and allow use of the mobile phone if a user is recognized as a valid user by way of sensor 102 that can be a camera.

Other sensors of mobile phone 100 include sensor 103 that can represent a microphone or a speaker or additional cameras or touch sensors. Mobile phone 100 can have any size and dimension. For example, the height of mobile phone 100 can be five or more inches and the width can be two or more inches. Sensor 102 can be less than a quarter of a centimeter while sensor 102 can be more than a centimeter. Mobile phone 100 can be other types of digital devices including a mobile computer or computing pad having varying dimensions. For example, as a computing pad, it can have a width larger than a width of mobile phone 100 and an activation button to activate it when in a sleep mode.

Figure 1B:
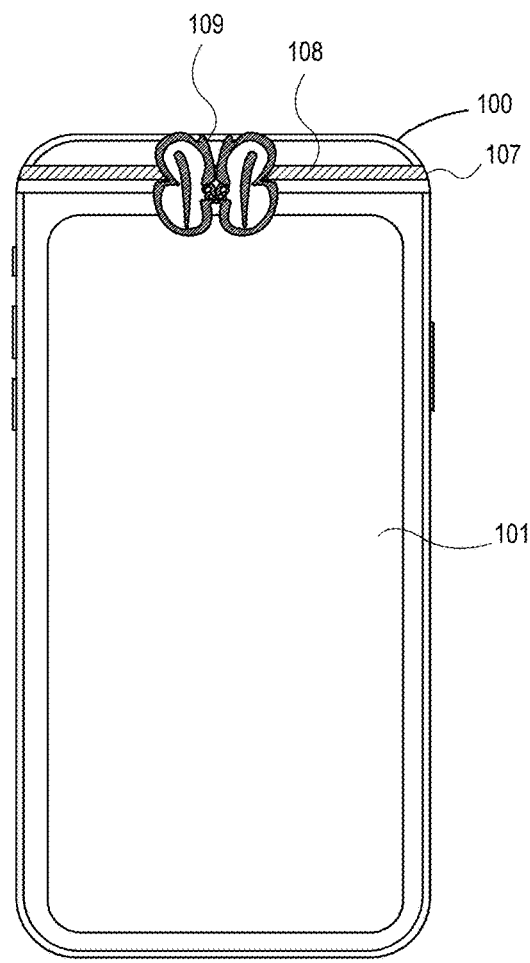
FIG. 1B illustrates the exemplary digital device of FIG. 1A having a detox band covering the sensor that activates the mobile phone device on the top side.

FIG. 1B illustrates the exemplary digital device such as mobile phone 100 of FIG. 1A having a detox band 107 with an elastic part 108 and a cover 109 that is positioned over sensor 102 including a camera used to activate mobile phone 100 on the top side. The elastic part 108 stretches and snugly fits around mobile phone 100. The cover 109 can be any shape and size having dimensions to sufficiently cover sensor 102 and disallow mobile phone 100 from being activated if in sleep mode. In this way, cover 109 can leave mobile phone 100 in sleep mode until the detox band 107 is removed. In this example, cover 109 can include a motif (e.g., butterfly) and cover other sensors such as sensor 103.

For one example, the elastic part 108 can have a length in the horizontal direction that is less than the width of mobile phone 100, a width in the vertical direction that is less or more than a centimeter, and a thickness can be a millimeter or less than half a centimeter. For one example, the cover 109 can be of any shape, size and thickness that sufficiently covers at least sensor 102 in order to prevent it from being activated while cover 109 is over sensor 102. In other words, cover 109 can prevent sensor 102 as a camera from capturing a face of a user to activate mobile phone 100.

For other examples, besides having a motif, cover 109 can include other shapes and sizes as shown in FIGS. 4A-4D. The cover 109 can be located in a central location of elastic part 108. In this example, cover 109, as a butterfly motif, covers both sensors 102 and 103. For one example, cover 109 and elastic part 108 can be one piece or unit and made of the same elastic material such as silicone having the same thickness. Other elastic materials for cover 109 and elastic part 108 can include silicone rubber, synthetic rubber, polymer or an elastomer. Once elastic part 108 is stretched around mobile phone 100, the detox band 107 should stay fixed to disallow face recognition by sensor 102 and activation of mobile phone 100 until a user physically removes the detox band 107 from mobile phone 100. After the detox band 107 is removed, a user can activate mobile phone 100 since the cover 109 is no longer blocking sensor 102 from capturing an image of a user for face recognition. Although detox band 107 is shown for a mobile phone 100, detox band 107 can be configured and have dimensions that can be used with other digital devices such as a mobile computer or computing pad that covers on one or more sensors used for activating the digital device when in sleep mode.

Figure 2A:
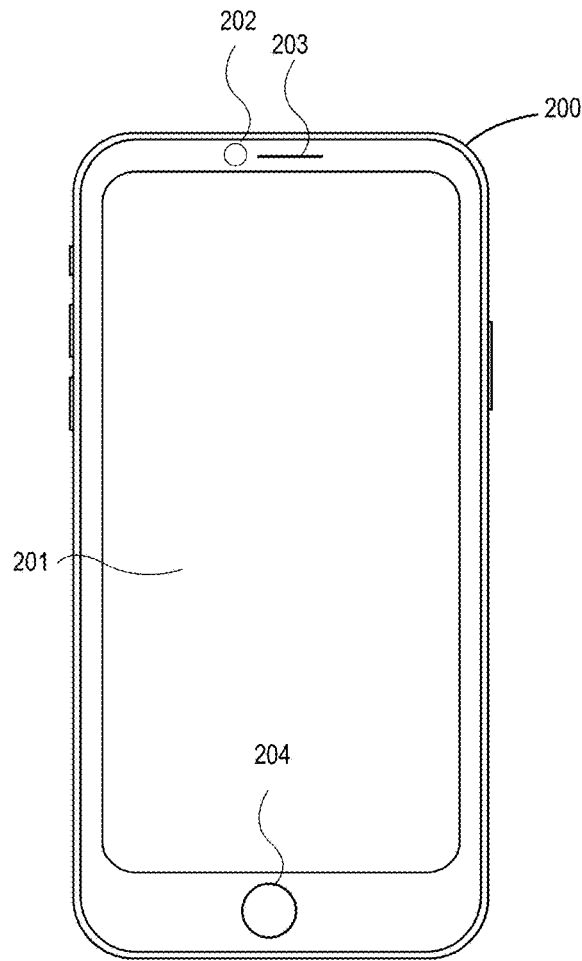
FIG. 2A illustrates an exemplary digital device such as a mobile phone with a sensor to activate the mobile phone on a bottom side.
Figure 2B:
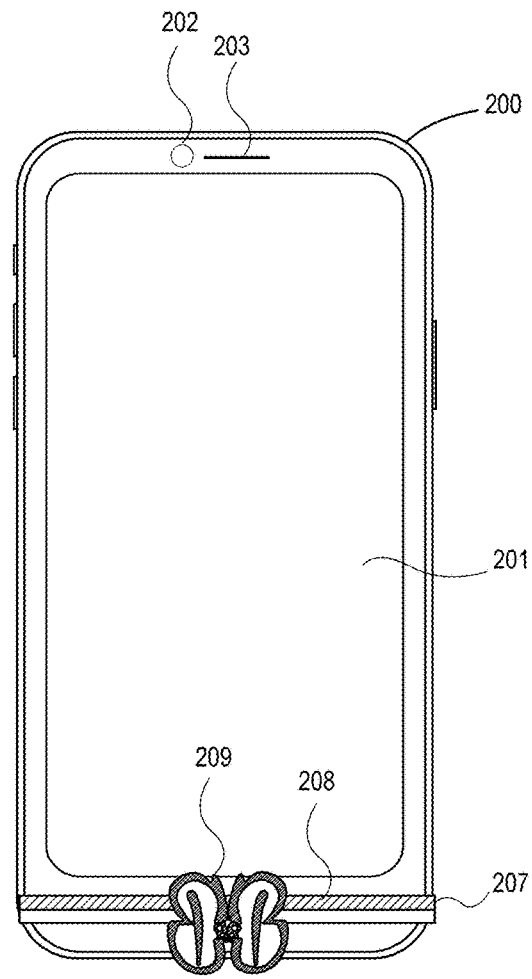
FIG. 2B illustrates the exemplary digital device of FIG. 2A having a detox band covering the sensor that activates the mobile phone device on the bottom side.

FIG. 2A illustrates an exemplary digital device as mobile phone 200 with a sensor 204 as a home button to activate the phone on a bottom side. In this example, mobile phone 200 includes sensors 102 and 203, which can include a camera and a microphone on a top side. When in sleep mode, the touch display 201 is off. A user can press on sensor 204, which is the home button, to activate phone 200. FIG. 2B illustrates the exemplary mobile phone 200 of FIG. 2A having a detox band 207 covering the sensor 204 that activates the mobile phone 200 on the bottom side. Referring to FIG. 2B, detox band 207 can be made in the same manner as detox band 107 having an elastic part 208 and a cover 209 that includes a butterfly motif. The elastic part 208 stretches and snugly fits around mobile phone 200 at the bottom side. The cover 209 is positioned over sensor 204 (home button) used to activate mobile phone 200. Similar to cover 109, cover 209 can leave mobile phone 200 in sleep mode until the detox band 207 is removed. For one example, the cover 209 has a sufficient thickness and size, which can be half a centimeter or less, that does not activate sensor 204 even if pressure is applied to cover 209. In this way, cover 209 of detox band 207 disallows access to sensor 204 for activating mobile phone 200.

Figure 2C:
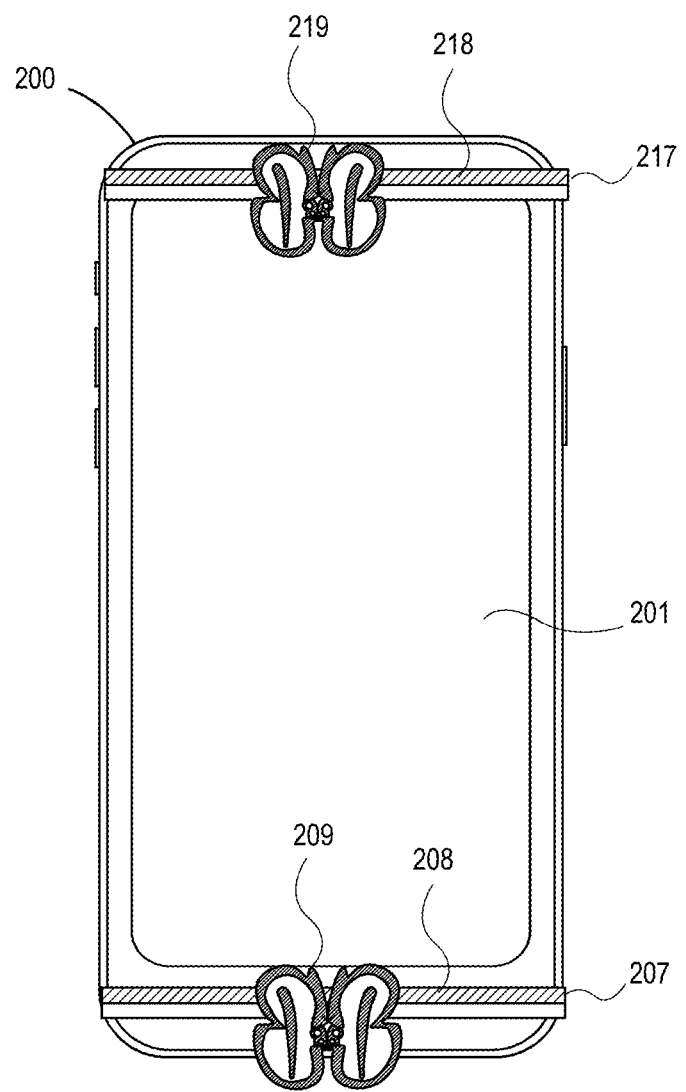
FIG. 2C illustrates the exemplary digital device of FIG. 2A having a first detox band covering a sensor on the top side and a second detox band covering a sensor on the bottom side of the mobile phone.

FIG. 2C illustrates the exemplary mobile device 200 of FIGS. 2A-2B having a first detox band 207 covering a sensor 204 on the bottom side and a second detox band 217 covering sensors 202 and 203 on the top side. In this example, first detox band 207 includes an elastic part 208 and a cover 209 and the second detox band 217 includes an elastic part 218 and a cover 219. Cover 209 includes a butterfly motif and is positioned over sensor 204 to disallow activation of the home button. Cover 219 includes a butterfly motif and is positioned over sensors 202 and 203. Although sensors 202 and 203 may not be configured to activate mobile phone 200 when in sleep mode, cover 219 can provide further protection or provide personal privacy or usage deterrence to the components 202 and 203 or prevent use even if mobile phone 200 is activated and a user is using touch display 201. In the situation where sensors 202 or 203 can be used to activate mobile phone 200, cover 219 can also disallow activation by preventing use of those sensors 202 and 203. Detox bands 207 and 217 can have the same dimensions and be made in the same manner as detox band 107 of FIGS. 1A-1B.

FIG. 3A illustrates an exemplary mobile phone 300 that can have sensors on a top side or a bottom side which are covered by a detox band 307. For one example, mobile phone 300 can have the same top side and bottom side sensors of mobile phone 200 of FIGS. 2A-2C. In this example, detox band 307 stretches vertically and snugly fits around mobile phone 300 in the vertical direction. The detox band 307 can have a longer length and use more silicon material than the detox bands 107, 207 and 217. Referring to FIG. 3A, on the top side, detox band 307 includes an elastic part 308 that can cover one or more sensors on a top side when it is stretched around mobile phone 300. For example, the elastic part 308 can have a width that is sufficient in size to cover sensors on the top side of mobile phone 300. On the bottom side, detox band 307 includes a cover 309 that covers a bottom sensor such as a home button and disallow activation mobile phone 300 by preventing use of the home button. FIG. 3B shows the same detox band 307 of FIG. 3A having an additional cover 319 on the top side, which can be used to cover sensors on the top side. In the examples of FIGS. 3A-3B, covers 309 and 319 can be used as a means to prevent activation of the digital device 300 and provide privacy protection from usage of the sensors under the covers 309 and 319 of the digital device 300.

Figure 4A:
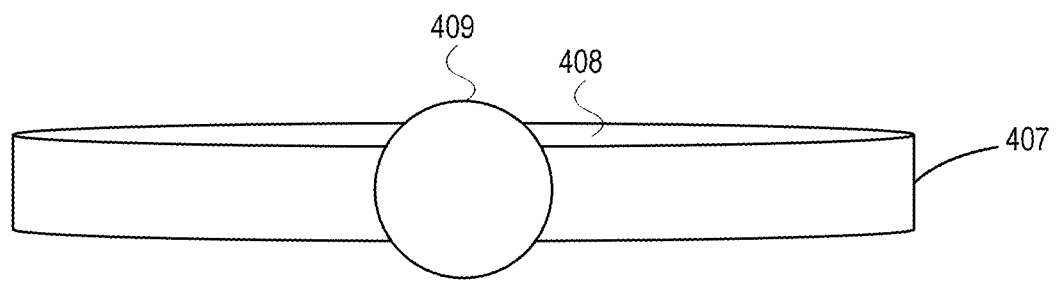
FIGS. 4A-4D illustrate exemplary detox bands with covers having different shapes and sizes.
Figure 4B:
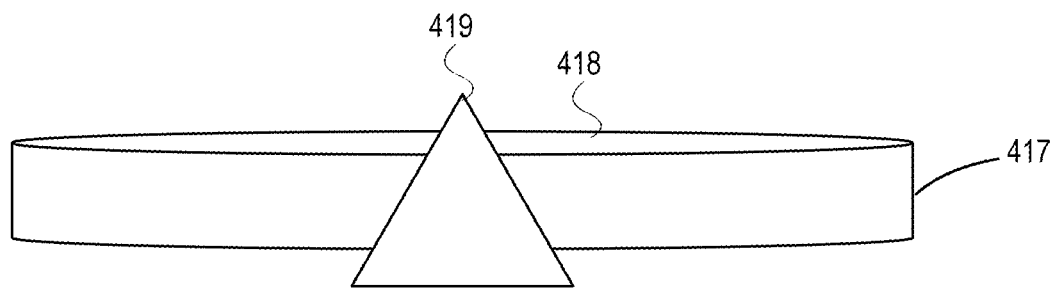
Figure 4C:
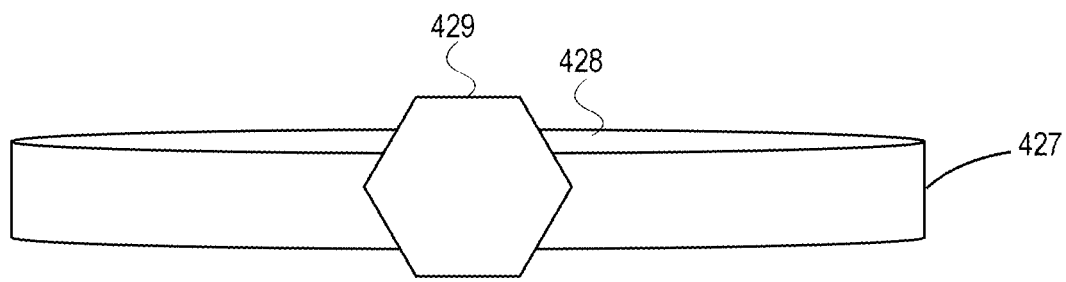
Figure 4D:
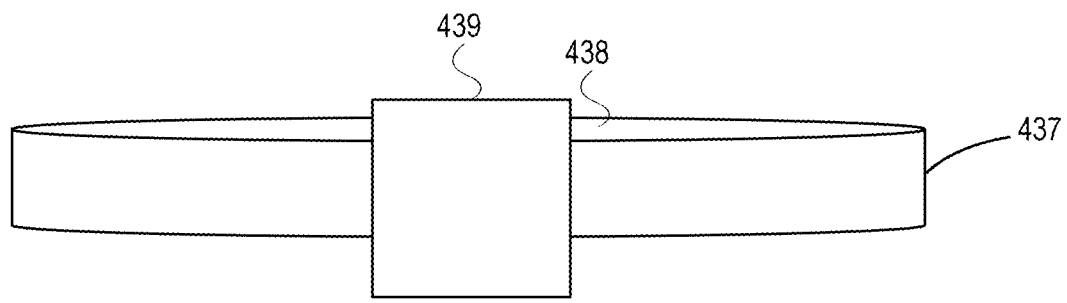

FIGS. 4A-4D includes exemplary detox bands 407 through 437 having varying sizes and shapes for covers. Referring to FIG. 4A, a detox band 407 includes an elastic part 408 having a circular cover 409. Referring to FIG. 4B, a detox band 417 includes an elastic part 418 having a triangular cover 419. Referring to FIG. 4C, a detox band 427 includes an elastic part 428 having a pentagonal cover 429. Referring to FIG. 4D, a detox band 437 includes an elastic part 438 and a square cover 439. In the above examples, elastic parts 408, 418, 428 and 438 can form a single piece or unit with covers 409, 419, 429 and 439 and be made of an elastic material such as silicone, silicone rubber, polymer or an elastomer. For other examples, covers 409, 419, 429 and 439 can be separate pieces of elastic material that are joined with elastic parts 408, 418, 428 and 438 such that the covers can be interchangeable and removed.

Figure 5:
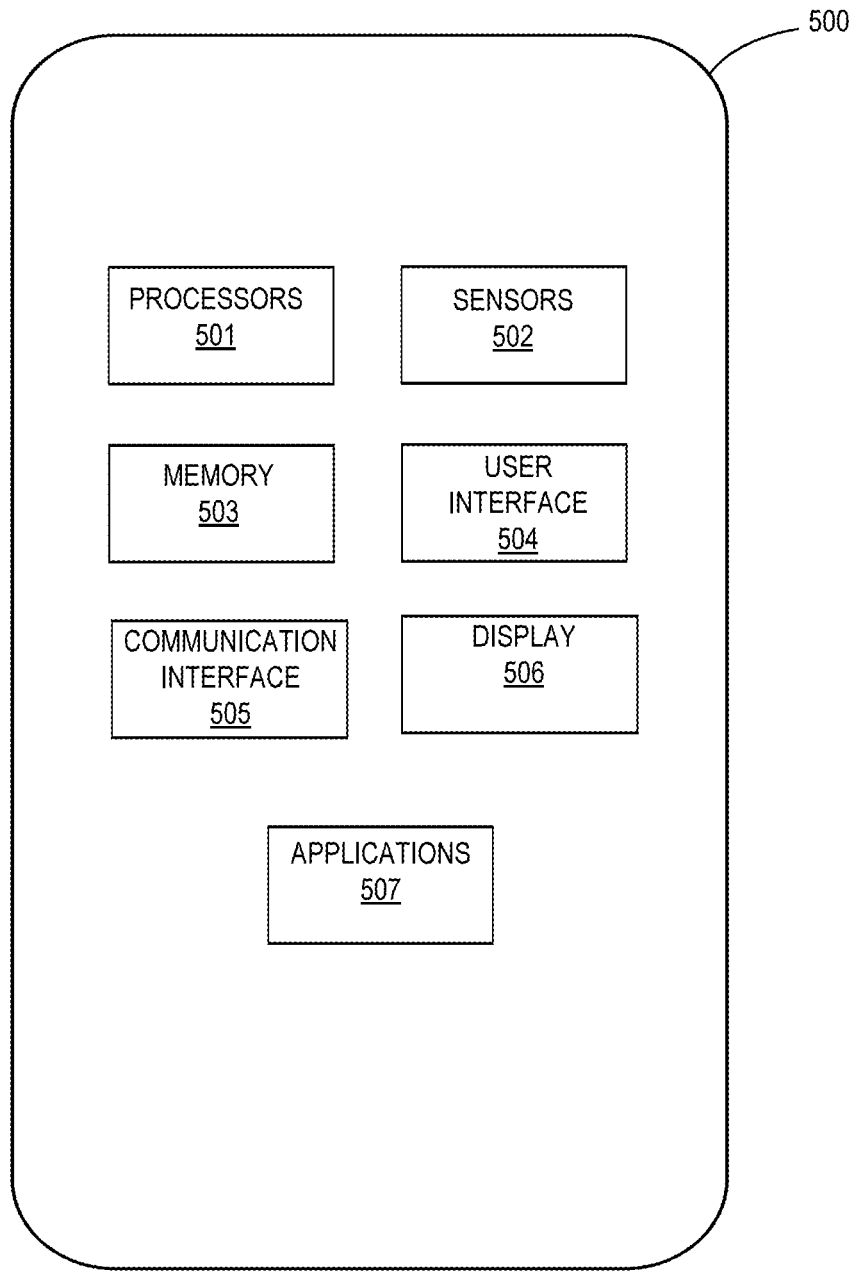
FIG. 5 illustrates an exemplary block diagram of basic components of a digital device.

FIG. 5 illustrates an exemplary block diagram of basic components of a digital device 500. Digital device 500 can be a data processing or computing system such as a mobile phone, mobile computer or computing pad having sensors 502 that can activate the device when in a sleep or power saving mode implemented by one or more applications 507 as described herein. Digital device also includes processors 501, memory 503, user interface 504 and communication interface 505. Processors 501 can include multiple processors to implement communication, interface and applications for digital device 500. Memory 503 can be any type of volatile or non-volatile memory storing data for digital device 500. Display 506 can include touch displays as shown in FIGS. 1A-4D. User interface 504 can process inputs from users from any number of sensors or inputs such as touch screens, touch pads, touch sensitive input devices, keyboards, dedicated keys (e.g. buttons for volume or mute or home, etc.). Communication interface 505 can include any type of communication modules such as modems, network interfaces, Bluetooth radio systems for wireless or wired communications.

Second Embodiment—Digital Device Detox Element and Method

Figure 6:
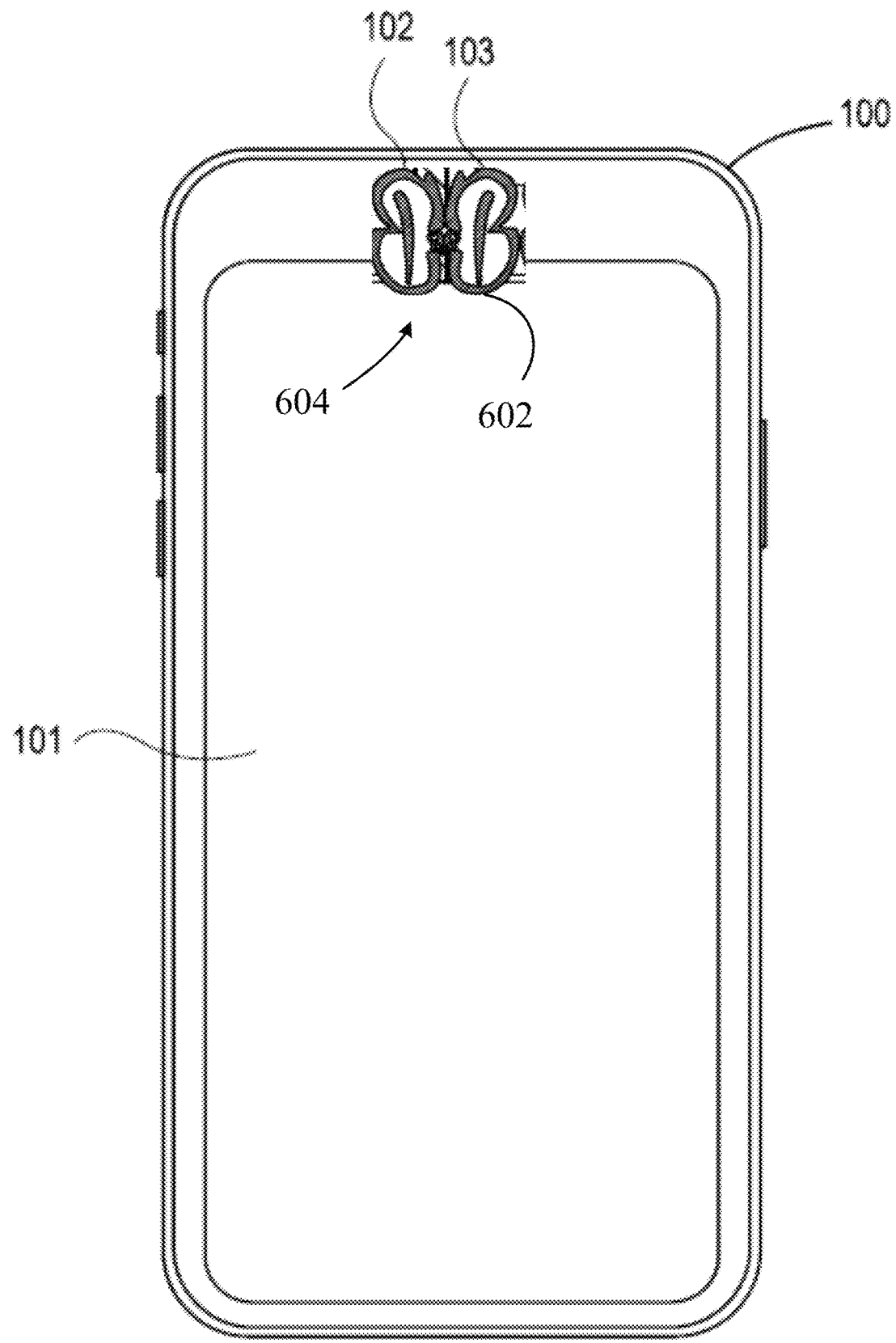
FIG. 6 illustrates the exemplary digital device of FIG. 1A having a detox element covering the sensor that activates the mobile phone device on the top side.

FIG. 6 illustrates the exemplary digital device of FIG. 1A having a detox element covering the sensor that activates the mobile phone device on the top side. FIG. 6 illustrates an exemplary digital device such as a mobile phone 100 with a sensor 102 to activate the mobile phone 100 on a top side. For one example, mobile phone 100 can represent a generic phone for any make and model having a sensor 102 that includes a camera used to recognize a face of a user. In this example, mobile phone 100 is configured to activate and allow a user to use the mobile phone 100 after the face of the user is authenticated using a face recognition application. For one example, mobile phone 100 can operate in sleep mode such that touch display 101 is off and can be activated by recognizing a face using sensor 102. Although a touch to the touch display 101 can cause the display to turn on, the mobile phone 100 is configured to activate and allow use of the mobile phone if a user is recognized as a valid user by way of sensor 102 that can be a camera.

Other sensors of mobile phone 100 include sensor 103 that can represent a microphone or a speaker or additional cameras or touch sensors. Mobile phone 100 can have any size and dimension. For example, the height of mobile phone 100 can be five or more inches and the width can be two or more inches. Sensor 102 can be less than a quarter of a centimeter or more than a centimeter.

FIG. 6 shows a detox element or sensor cover 602 placed at a first location 604 over sensor 102 including a camera used to activate mobile phone 100 on the top side. The detox element 602 is a sensor cover that can be any shape and size having dimensions to sufficiently cover sensor 102 and disallow mobile phone 100 from being activated if in sleep mode. In this way, sensor cover 602 can leave mobile phone 100 in sleep mode until the detox element/sensor cover 602 is removed. In this example, sensor cover 602 can include a motif (e.g., butterfly, flower, kitten, etc.) and cover other sensors such as sensor 103. The sensor cover and motif can be any shape, color and design desired by the user. The motif can be an emoji, a small picture of a loved one or pet, or any other design that appeals to the user and thus enhances the desirability of using the detox process.

In one embodiment, sensor cover 602 is between 5 mm and 9 mm in thickness, has a width (length in the horizontal direction) between 2.5-3.0 cm, and has a height between 2.0-2.5 cm. In other embodiments, sensor cover 602 is between 3.5 mm and 12 mm in thickness, has a width (length in the horizontal direction) between 2.0-3.5 cm, and has a height between 1.5-2.5 cm. In a further embodiment, sensor cover has a height of approximately 2.2 cm and a width of approximately 2.85 cm, with an approximate thickness of 0.7 cm (7 mm). Sensor cover 602 is a flexible, solvent based non-adhesive material with static cling as a binding agent. In one embodiment, being a removable vinyl.

For one example, sensor cover 602 can be of any shape, size and thickness that sufficiently covers at least sensor 102 in order to prevent it from being activated while sensor cover 602 is over sensor 102. In other words, sensor cover 602 can prevent sensor 102 as a camera from capturing a face of a user to activate mobile phone 100. In addition, sensor cover 602 is sufficiently small so that it can be placed in a ready position at a corner of the device without significantly blocking the display as discussed below, but still be visible to remind the user of the sleep mode placement option when detox is desired.

For other examples, besides having a motif, sensor cover 109 can include other shapes and sizes as shown in FIGS. 4A-4D, without the band. In this example, sensor cover 602 is a butterfly motif, covering both sensors 102 and 103. Once sensor cover 602 is placed over the sensors, static cling will cause it to stay fixed to disallow face recognition by sensor 102 and activation of mobile phone 100 until a user physically removes the sensor cover 602 and/or repositions it back to the ready position on mobile phone 100. After sensor cover 602 is removed or repositioned, a user can activate mobile phone 100 since the sensor cover 602 is no longer blocking sensor 102 from capturing an image of a user for face recognition. Although sensor cover 602 is shown for a mobile phone 100, sensor cover 602 can be configured and have dimensions that can be used with other digital devices such as a mobile computer or computing pad that covers on one or more sensors used for activating the digital device when in sleep mode.

Figure 7A:
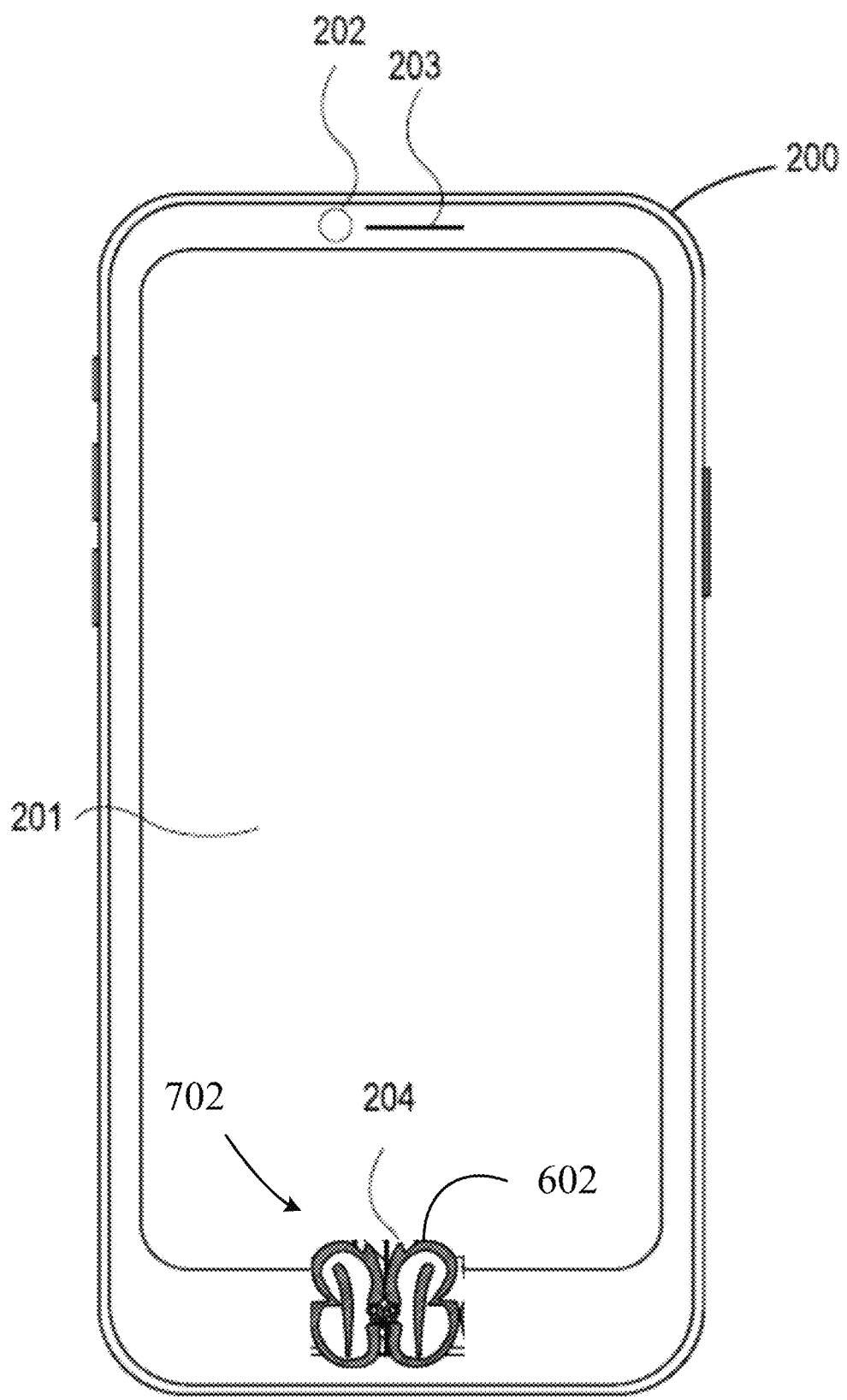
FIG. 7A illustrates the exemplary digital device of FIG. 2A having a detox element covering the sensor that activates the mobile phone device on the bottom side.

FIG. 7A illustrates the exemplary digital device of FIG. 2A having a detox element covering the sensor that activates the mobile phone device on the bottom side. FIG. 7A illustrates the exemplary mobile phone 200 of FIG. 2A having a sensor cover 602 at a position 702 covering the sensor 204 that activates the mobile phone 200 on the bottom side. The sensor cover 602 is positioned over sensor 204 (home button) used to activate mobile phone 200. Sensor cover 602 can leave mobile phone 200 in sleep mode until sensor cover 602 is removed and/or repositioned. For one example, the sensor cover 602 has a sufficient thickness and size that does not activate sensor 204 even if pressure is applied to sensor cover 602. In this way, sensor cover 602 disallows access to sensor 204 for activating mobile phone 200.

Figure 7B:
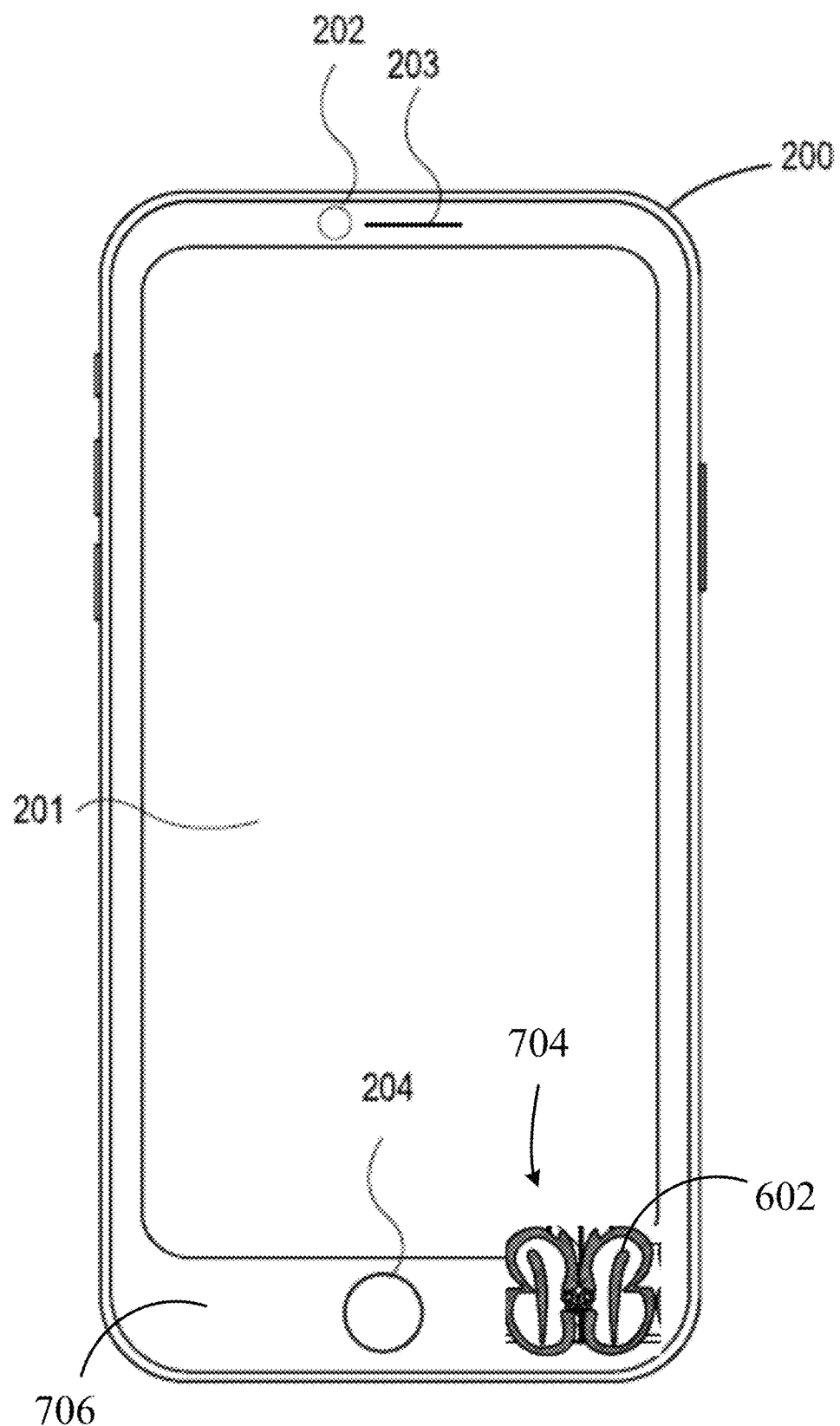
FIG. 7B illustrates the exemplary digital device of FIG. 2A having a detox element moved to a ready location.

FIG. 7B illustrates the exemplary digital device of FIG. 2A having a detox element moved to a ready location. As shown, the ready location 704 is at the lower right corner of the phone. As shown, sensor cover 602 is sufficiently small that it is mostly on a bezel 706 of the phone, around display 201, with only a small portion impinging on display 201. It will impinge more on the display for newer designs with smaller bezels, but is still occupying only a very small portion of the screen. Alternately, the sensor cover ready location could be proximate to the lower left corner, the upper left corner, the upper right corner, or any other position around the edge of the phone. Sensor cover 602 could also be placed on the back of the device, but that would take it out of the user's view and eliminate the reminder feature of having the sensor cover visible while the display is being used, to remind the user to take a break and detox.

Figure 8:
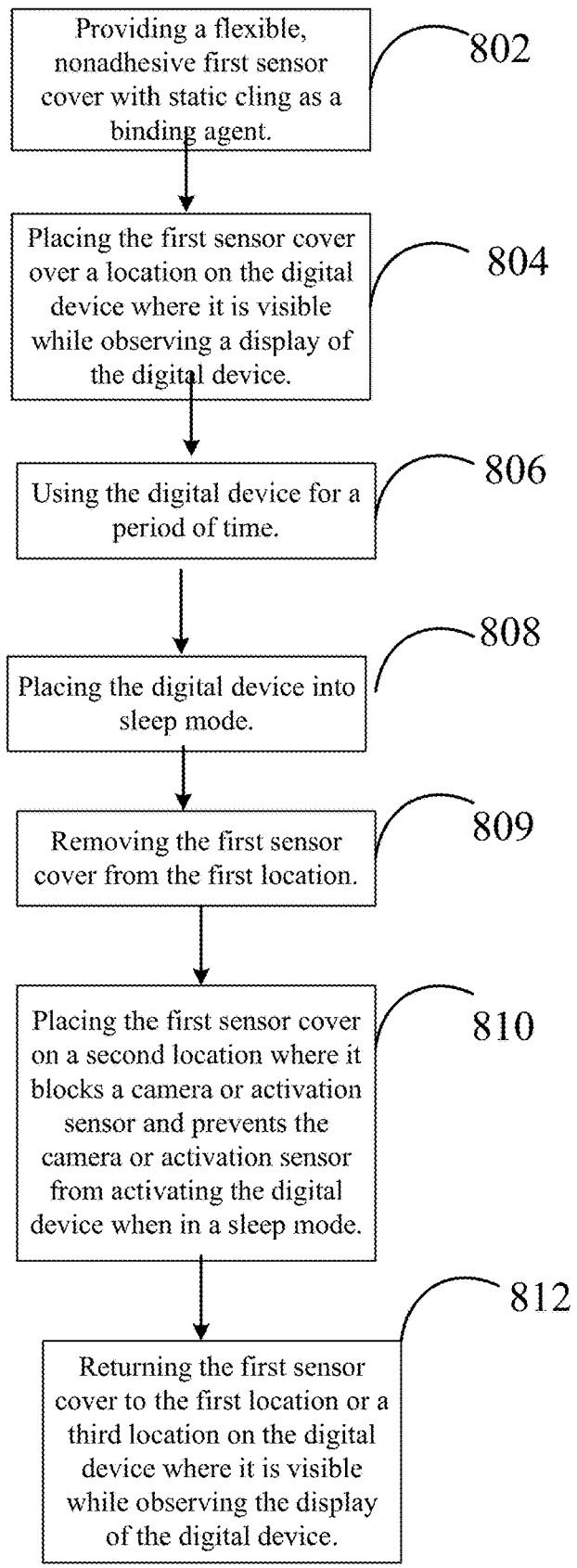
FIG. 8 illustrates the exemplary digital device of FIG. 2A having a detox element moved to a ready position.

FIG. 8 is a flowchart illustrating one embodiment of the method of the present invention. Step 802 is providing a flexible, nonadhesive first sensor cover with static cling as a binding agent. Step 804 is placing the first sensor cover over a first location on the digital device where it is visible while observing the display of the digital device. Step 806 is using the digital device for a period of time. Step 808 is placing the digital device into sleep mode. This can be done by simply not interacting with the phone for a period of time, allowing it to enter a sleep mode after a period of inactivity. The period of inactivity can be adjusted by the user in one embodiment. Step 809 is removing the first sensor cover from the first location. Step 810 is placing the first sensor cover on a second location where it blocks a camera or activation sensor and prevents the camera or activation sensor from activating the digital device when in a sleep mode. Step 812 is returning the first sensor cover to the first location or a third location on the digital device where it is visible while observing the display of the digital device. The first sensor cover is sufficiently small to allow it to block ten percent or less, or 5 percent or less, of the display of the digital device in the first location. The first sensor cover is sufficiently large enough to block the camera or activation sensor while blocking either none or only a portion of a display of the digital device.

Sensor covers 602, also referred to as "mobily mindful" motifs, are a secondary option to digital device detox bands that creates a choice in allowances for digital respite, especially when there is currently no material intervention apparatus. Not only do Mobily Mindful™ motifs offer users daily digital screen intervention, but they also serve as a fixed visual cognition to self-care and self-awareness for themselves in relative relationship to their physical interactive community and the instant accesible world right in the faces of all users. A simple pause for cognitive cause allows critical momentary thinking, introspection and mindful practices. The Mobily Mindful™ motif is designed for users to exercise a variety of choice in placement and preferential design onto the mobile display screen that lends way to a constant and continuous visual cognition to self, community and physical world interface awareness with a fixed artistic designed logo motif.

The main utility of the Mobily Mindful™ motif is intercepting instantaneous one click digital programming of nonstop, non-academic applications by implementing screen activation prevention, which pivots the human mindset from instant digital access to the deliberate delay by manually keying in (old analog) access.

In one embodiment, a Mobily Mindful™ motif is a flat one dimensional, solvent based nonadhesive, static cling like removable vinyl material, scratch and abrasion resistant with the approximate diameter being one inch. The Mobily Mindful™ motif covers the entirety of the camera lens and activation sensor of any mobile device and is approximately 3.5 mm to 12 mm in thickness; and wherein the sensor cover is further sized to block a tiny portion being, three to five percent of the entire mobile screen display, by not obscuring the remaining ninety five percent of display screen.

For one example, the Mobily Mindful™ motif can be of various coloration, shapes, logos and or artistic design for user's personal choice in selecting their preferential pre-manufactured fixed design motif with its freedom of placement on any screen display of a mobile phone. Choice of placement include: the upper or lower, right or left corner of the display screen.

For one example, when users select the placement in having the mobile motif directly covering phone's camera lens or activation sensor, this direct placement of lens coverage provides users the means and mechanism of activation prevention to the never off—always on, mobile phone that unceasingly restrict users' undivided attention to a three by five inch or other size screen space. This fundamental mechanism for critical restrictive digital mindset intervention has not been materially available to users until now. The covered lens and screen activation sensor puts phone in temporary hibernation mode, while still maintaining standard home screen displays of date, time, battery life, Wi-Fi reception, alongside of real time (visual only) access to incoming push notifications of emails, text messages and the like, allowing restrictive digital mindsets to pivot back to a nonrestrictive innate human operating system.

For one example, in addition to users initiating digital respite by putting phone into hibernation mode via placement of the Mobily Mindful™ motif over front side of camera lens will also deactivate the mobile system's interface with audio, visual and geolocation presets for privacy protection. Hibernation and privacy mode still maintains instant access and allowance for direct user interface to Power Off or reach SOS Emergency call options to be displayed onto home screen by, in one embodiment, the simultaneous holding down of both right side (top) and left side buttons to activate prompt(s). Hibernation and privacy mode entails user to analog access by having to manually input security pin to return phone back into direct user interface or by having the fixed Mobily Mindful™ motif re-positioned to any one of the outer four corners of screen display.

For one example, when users choose a placement other than covering the lens and display screen activation sensor, i.e., an alternate placement of either bottom or upper—right or left corner, their display screen now remains active, however the means of the stationary motif now serves as a visual cognition to physical self inclusion as the artistic motif design is relative to users' preferential logo that references self-care, sports, health, fashion, pets and the like. The mobile motif is a cognitive apparatus that pivots avatar like mobile mindsets with the constant visual association to a non-digitized human physical self-awareness initiative. The fixed mobile motif's minimalistic attributes, maximizes display transparency and deterrence of constant screen addiction. This motif modality is not a cosmetic phone novelty, but an intervention and protection for long term physiological and psychological human health.

For one example, user may use two separate mindfully mobile motifs by using the first one to cover the front facing lens while using the second motif to cover the backside lens for mobile respite and privacy protection.

Digital Device

Figure 9:
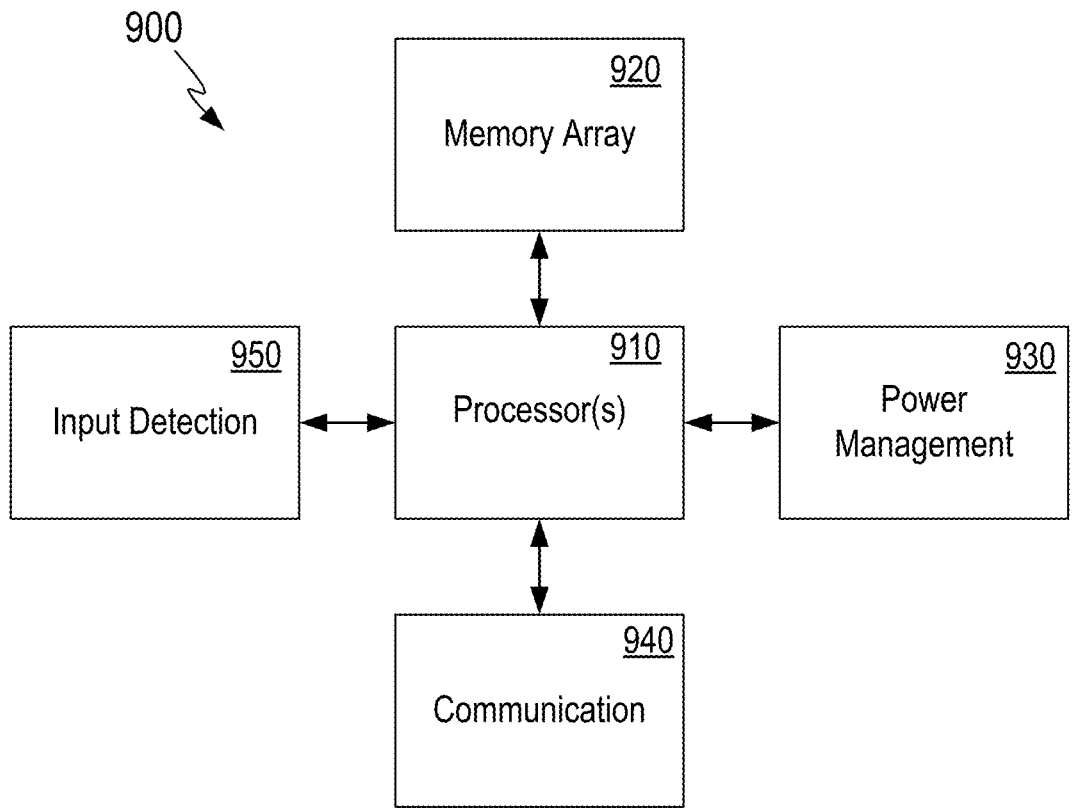
FIG. 9 is a flowchart illustrating one embodiment of the method of the present invention.

FIG. 9 shows a system 900 for operating a digital device (e.g., mobile phone or other user input device 100), according to certain embodiments. System 900 includes processor (s) 910, memory array 920, power management system 930, communication system 940, and input detection module 950. Each of the system blocks 920-950 can be in electrical communication with the processor(s) 910 (e.g., via a bus system). System 900 may further include additional systems that are not shown or discussed to prevent obfuscation of the novel features described herein. System blocks 920-950 may be implemented as separate modules, or alternatively, more than one system block may be implemented in a single module. Note that system 900 provides examples of some typical systems that can be used to implement the various embodiments described here and any modifications, variations, and alternative implementations may be used, as would be appreciated by one of ordinary skill in the art with the benefit of this disclosure.

Processor 910 is configured to control the operation of system 900. Alternatively, processor(s) 910 may include one or more microcontrollers (MCUs), digital signal processors (DSPs), or the like, with supporting hardware and/or firmware (e.g., memory, programmable I/Os, etc.), as would be appreciated by one of ordinary skill in the art. Processor(s) 910 can control some or all aspects of operation of user input device 100 (e.g., system block 920-950). Alternatively or additionally, some of system blocks 920-950 may include an additional dedicated processor, which may work in conjunction with processor 910. One of ordinary skill in the art would understand the many variations, modifications, and alternative embodiments thereof.

Memory array 920 may be configured to store information pertaining to one or more operational configurations of user input device 100. As further discussed below, one or more operational configurations of user input device 100 may include setting performance characteristics of user input device 100.

Additionally, memory array 920 can store one or more software programs to be executed by processors (e.g., in processor(s) 910). It should be understood that "software" can refer to sequences of instructions that, when executed by processing unit(s) (e.g., processors, processing devices, etc.), cause system 900 to perform certain operations of software programs. The instructions can be stored as firmware residing in read-only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. More germane to the present disclosure, memory array 920 (along with processor 910) may include instructions (realized via software, firmware, hardware, and in any combination thereof) configured to implement having a covered lens and screen activation sensor put the phone in a temporary hibernation mode, while still maintaining standard home screen displays of date, time, battery life, Wi-Fi reception, alongside of real time (visual only) access to incoming push and notifications of emails, text messages and the like.

Power management system 930 can be configured to manage power distribution, recharging, power efficiency, and the like, for user input device 100. In some embodiments, power management system 930 can include a battery (not shown), a USB based recharging system for the battery (not shown), and power management devices (e.g., low-dropout voltage regulators—not shown). In certain embodiments, the functions provided by power management system 930 may be incorporated into processor(s) 910. The power source can be a replaceable battery, a rechargeable energy storage device (e.g., super capacitor, Lithium Polymer Battery, NiMH, NiCd), or a corded power supply. The recharging system can be an additional cable (specific for the recharging purpose) or it can use a USB connection to recharge the battery.

Communications system 940 can be configured to provide wireless and/or wired communication between processors 910 and one or more of user input device 100, according to some examples. Communications system 940 can be configured to provide radio-frequency (RF), Bluetooth®, BLE, WiFi, infra-red (IR), ZigBee®, Logitech Unifying®, or other suitable communication technology to communicate with other computing devices and/or peripheral devices. Communications system 940 may also provide hardwired connection with processors 910. The hardwired connection can include a serial interconnect such as, for example, Universal Serial Bus (USB), FireWire®, DisplayPort®, etc.

One example of communication system 940 can be a dongle, which can provide a combination of wireless and wired communication between processors 910 and one or more of user input device 100. For example, the dongle may include a wired connector interface (e.g., a USB connector) which can be plugged into a hardwire interface port (e.g., a USB port). The hardwire interface port, in turn, is connected to processors 910 via a hardwired interconnect (e.g., USB buses). Moreover, the dongle may also include a wireless interface (e.g., a Bluetooth® wireless interface) to perform wireless data transfer with user input device 100. The dongle can receive sensor data from user input device 100 via the wireless interface, and transmit the sensor data to processors 910 via the hardwired interconnect.

Input detection module 950 can control the detection of a user-interaction with input elements on user input device 100. For instance, input detection module 950 can detect user inputs based on sensor data from computer mouse 130. In some embodiments, input detection module 950 can work in conjunction with memory array 920 to generate input data to processors 910 based on the sensor data received from communication system 940. For example, based on scrolling speed information stored in memory array 920 as well as sensor data from computer mouse 130, input detection module 950 can calculate a distance traversed by a mouse pointer on display 120, and provide the distance information to processors 910 (or a renderer) to render the movement of the mouse on display 120.

Although certain systems may not expressly discussed, they should be considered as part of system 900, as would be understood by one of ordinary skill in the art. For example, system 900 may include a bus system to transfer power and/or data to and from the different systems therein.

It should be appreciated that system 900 is illustrative and that variations and modifications are possible. System 900 can have other capabilities not specifically described herein. Further, while system 900 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained.

Embodiments of the present invention can be realized in a variety of apparatuses including electronic devices implemented using any combination of circuitry and software. Furthermore, aspects and/or portions of system 900 may be combined with or operated by other sub-systems as required by design. For example, input detection module 950 and/or memory array 920 may operate within processor(s) 910 instead of functioning as a separate entity. In addition, the inventive concepts described herein can also be applied to various devices and are not limited to phones. System 900 can be applied to any of the devices described in the embodiments herein, whether explicitly, referentially, or tacitly described (e.g., would have been known to be applicable to a particular peripheral device by one of ordinary skill in the art). The foregoing embodiments are not intended to be limiting and those of ordinary skill in the art with the benefit of this disclosure would appreciate the myriad applications and possibilities.

The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method for detoxing from digital device usage comprising:
   (a) providing a flexible, nonadhesive first sensor cover with static cling as a binding agent;
   (b) placing the first sensor cover over a first location on a digital device where it is visible while observing a display of the digital device without blocking most of the display;
   (c) using the digital device for a period of time;

(d) removing the first sensor cover from the first location;
(e) placing the first sensor cover on a second location where it blocks a camera or activation sensor and prevents the camera or activation sensor from activating the digital device when in a sleep mode;
(f) returning the first sensor cover to the first location or a third location on the digital device where it is visible while observing the display of the digital device;
(g) wherein the first sensor cover is sufficiently small to allow it to block ten percent or less of the display of the digital device in the first location; and
(h) wherein the first sensor cover is sufficiently large to block the camera or activation sensor while blocking either none or only a portion of a display of the digital device.

2. The method for detoxing from digital device usage of claim 1, wherein the first sensor cover is vinyl.

3. The method for detoxing from digital device usage of claim 1, wherein the first sensor cover is between 3.5 mm and 12 mm in thickness, has a width between 2.0-3.5 cm, and has a height between 1.5-2.75 cm.

4. The method for detoxing from digital device usage of claim 1, wherein the activation sensor is a touch sensor or an activation button to activate the digital device.

5. The method for detoxing from digital device usage of claim 4, wherein the digital device is a mobile phone device, mobile computing device or computing pad having varying dimensions.

6. The method for detoxing from digital device usage of claim 1, further comprising:
placing an additional sensor cover over an additional sensor not covered by the first sensor cover.

7. The method for detoxing from digital device usage of claim 1, wherein the first sensor cover is placed over the camera of the digital device, providing a privacy function in addition to activation prevention.

8. The method for detoxing from digital device usage of claim 1, where the first sensor cover includes a motif.

9. The method for detoxing from digital device usage of claim 1, wherein the first sensor cover is sufficiently small to allow it to block five percent or less of the display of the digital device in the first location.

10. The method for detoxing from digital device usage of claim 1, wherein the first location is proximate one of the corners of the digital device.

11. A system comprising:
a digital device, including:
a device housing;
a processor,
a programmed memory;
a communication system,
a power management system,
a touch-screen display, and
at least one of a camera, a touch sensor, and an activation button; and
a flexible, nonadhesive first sensor cover with static cling as a binding agent removably placed over at least one of the camera, touch sensor, and activation button;
wherein the first sensor cover is sized to cover at least one of a camera, a touch sensor, and an activation button and has a width between 2.0-3.5 cm and a height between 1.5-2.75 cm, such that it can be placed in a ready position at a corner of the digital device without significantly blocking the touch-screen display;
wherein the first sensor cover covers the camera, touch sensor or activation button such that they are prevented from activating the digital device when in a sleep mode.

12. The system of claim 11, wherein first sensor cover is vinyl.

13. The digital device of claim 11, wherein the first sensor cover is between 3.5 mm and 12 mm in thickness.

14. The system of claim 11, wherein the digital device is a mobile phone, mobile computer or pad having varying dimensions.

15. The system of claim 11, further comprising:
a second, separate sensor cover placed over another sensor not covered by the first sensor cover.

16. The system of claim 11, wherein the first sensor cover is sufficiently small to allow it to block five percent or less of the touch screen display of the digital device when moved to a location on the digital device where it is visible while observing the display.

17. The system of claim 16, wherein the first sensor cover includes a motif.

18. A method for detoxing from digital device usage comprising:
(a) providing a flexible, nonadhesive first sensor cover with static cling as a binding agent;
(b) placing the first sensor cover over a first location on the digital device where it is visible while observing a display of the digital device without blocking most of the display;
(c) using the digital device for a period of time;
(d) putting the digital device into a sleep mode;
(e) removing the first sensor cover from the first location;
(f) placing the first sensor cover on a second location where it blocks a camera or activation sensor and prevents the camera or activation sensor from activating the digital device when in a sleep mode, thereby entering a detox period;
(g) returning the first sensor cover to the first location or a third location on the digital device where it is visible while observing the display of the digital device, to allow exit from the sleep mode;
(h) wherein the first sensor cover is sufficiently small to allow it to block ten percent or less of the display of the digital device in the first location; and
(i) wherein the first sensor cover is sufficiently large to block the camera or activation sensor while blocking either none or only a portion of a display of the digital device;
(j) wherein the first sensor cover is vinyl;
(k) wherein the first sensor cover is between 3.5 mm and 12 mm in thickness, has a width between 2.0-3.5 cm, and has a height between 1.5-2.75 cm;
(l) wherein the one or more sensors include a camera, a touch sensor, or an activation button to activate the digital device; and
(m) wherein the first position is proximate one of the corners of the digital device.

19. The method for detoxing from digital device usage of claim 18, wherein the first sensor cover is placed over the camera to provide a privacy function in addition to activation prevention; and
wherein the first sensor cover includes a motif.

20. The system of claim 11,
wherein the flexible, nonadhesive first sensor cover is removably placed over the camera;
wherein the first sensor cover is sized to cover the camera; and
wherein the first sensor cover covers the camera, such that the camera is prevented from activating the digital device using face recognition when in a sleep mode.

* * * * *